United States Patent [19]
Roh et al.

[11] Patent Number: 5,790,465
[45] Date of Patent: Aug. 4, 1998

[54] WAFER BURN-IN TEST CIRCUIT AND A METHOD THEREOF

[75] Inventors: Jae-gu Roh, Suwon; Soo-in Cho, Seoul, both of Rep. of Korea

[73] Assignee: Samsung Electronics Co., Ltd., Suwon, Rep. of Korea

[21] Appl. No.: 714,577

[22] Filed: Sep. 16, 1996

[30] Foreign Application Priority Data

Sep. 15, 1995 [KR] Rep. of Korea ............... 1995-30234

[51] Int. Cl.⁶ .............................. G11C 29/00; G11C 7/00
[52] U.S. Cl. ................... 365/201; 365/230.06; 371/21.1
[58] Field of Search ................... 365/201, 230.06, 365/230.04; 371/21.1

[56] References Cited

U.S. PATENT DOCUMENTS

| | | | |
|---|---|---|---|
| 5,265,057 | 11/1993 | Furuyama et al. | 365/201 |
| 5,467,356 | 11/1995 | Choi | 371/21.1 |
| 5,590,079 | 12/1996 | Lee et al. | 365/201 |

Primary Examiner—David C. Nelms
Assistant Examiner—Huan Hoang
Attorney, Agent, or Firm—Jones and Volentine, LLP

[57] ABSTRACT

A burn-in test circuit of a semiconductor memory device with a first test circuit having output terminals connected to input terminals of a first half of plurality of word line drivers. A second test circuit has output terminals connected to input terminals of a second half of the plurality of word line drivers. The first and second tests circuits are sequentially activated to perform a burn-in test for all the memory cells.

5 Claims, 3 Drawing Sheets

WAFER BURN-IN TEST CIRCUIT AND A METHOD THEREOF

BACKGROUND OF THE INVENTION

1. Field of the Invention

The present invention relates to semiconductor memory devices, and more particularly to a burn-in test circuit which can screen, in a wafer state, failed devices of a semiconductor memory in which data stored at adjacent memory cells have different logic levels to each other, by dividing a plurality of word lines and then applying a stress voltage.

The present invention for a wafer burn-in test circuit and a method thereof, is based on Korean Patent Application Serial No. 30234/1995 which is incorporated herein by reference for all purposes.

2. Description of the Related Art

Generally, semiconductor memory devices undergo a screening operation for exposing and removing failed devices to prevent the deterioration of the other fail-free devices, thereby ensuring the reliability thereof. A burn-in test method (also referred to as a "stress test") is frequently used for such a screening operation. The burn-in test is performed in a state where a test voltage is set higher than a practically-used voltage and the temperature is set higher than a practically-used temperature. In such a method, a greater stress than that generated during a typical failure is applied to the semiconductor memory device for a shorter time. Then, any device that failed this initial stress test can be sorted and effectively removed before being sent out, thereby improving the reliability of the semiconductor memory device.

In addition to the improvement in reliability, the manufacturing costs for the device are also affected by the time required for the burn-in test. Accordingly, there has been strong demand for a burn-in test circuit which can reduce the test time.

Typically, the burn-in test is carried out for packaged devices, which is beneficial for assuring the reliability of the final products. However, parts that fail during the burn-in test must be abandoned, but they have already gone through the test and assembly steps. This increases the total production cost. In order to solve this problem, proposal have been made for circuits that perform the burn-in test in the wafer state.

Most of the burn-in failures for DRAMs are single bit failures. Single bit failures are directly related to leakages in incomplete memory cells. Possible leakage locations are the transfer gate oxide, capacitor dielectric and storage node junctions. If the burn-in test is separately performed for each bit line, however, there is a greater time loss due to the screening.

In a conventional burn-in test in the package state, therefore, one particular word line is selected once every thousands of cycles, thereby reducing the time lost during the testing process. However, in order to more accurately identify failed devices, some have proposed a method for simultaneously selecting all word lines by one operation. Such a simultaneous selection of all word lines is possible using a burn-in test in the wafer state.

The wafer burn-in (hereinafter referred to as a "WBI") circuit disclosed in Tohru Furuyama, "Wafer Burn-in Technology for RAM's", IEEE, pp. 639–642, 1993, is shown in FIG. 1. Referring to FIG. 1, a plurality of memory cells $4a$–$4n$ are connected between a plurality of word lines $WLa$–$WLn$ and a plurality of bit line pairs $BL/\overline{BL}$. For convenience of illustration, FIG. 1 shows only one of a plurality of bit line pairs. One end of the word lines WL are respectively connected a word line driver 6 and the other end thereof to one end of NMOS transistors $10a$–$10n$, respectively. The other respective ends of the NMOS transistors $10a$–$10n$ are connected to a test voltage Vg, and the control gates thereof to a test control voltage Vstress.

In the case of 4K refresh devices, the burn-in stress time for one word line in the wafer burn-in test is equal to the entire burn-in time divided by 4K. If this wafer burn-in circuit is applied to the DRAMs, all selected word lines are simultaneously supplied with the stress voltage, thus enabling the burn-in test to be carried out in a much shorter time. In FIG. 1, two pads, i.e. the test voltage Vg and the test control voltage Vstress, are introduced for supplying the higher voltage to the word lines during the wafer burn-in test. A desired stress can be applied to the capacitor dielectric or the junction by externally controlling a bit line voltage and a plate voltage Vpl supplied to a plate node of each memory cell. Thus the small leakage current path can be completely destroyed to an extent causing a functional failure.

The above-described wafer burn-in test technique according to FIG. 1 screens the failed memory cells in a shorter time in the wafer state. However, with this burn-in test, the data stored at all memory cells should be identical. That is, since the test voltage is simultaneously applied to all word lines during the wafer burn-in test, if the data stored at the memory cells connected to the same bit line are not identical, it is difficult to identify the failed memory cell due to the leakage current because of the offset between the memory cells. Thus, the reliability of the test is reduced.

SUMMARY OF THE INVENTION

It is therefore an object of the present invention to provide a burn-in test circuit which can easily detect failed memory cells due to a leakage current in a semiconductor memory device, having a plurality of memory cells in a row stripe pattern in which data stored at adjacent memory cells are different from each other.

It is another object of the present invention to provide a wafer burn-in test method of a semiconductor memory device, which can screen initial failed cells regardless of the pattern of the data stored at the adjacent memory cells.

To achieve one object of the present invention, there is provided a burn-in test circuit of a semiconductor memory device having a plurality of memory cells connected to at least one bit line, and a plurality of word line drivers for selecting certain of the plurality of word lines connected to the plurality of memory cells, comprising: a first test circuit having output terminals connected to input terminals of a first half of the plurality of word line drivers; a second test circuit having output terminals connected to input terminals of a second half of the plurality of word line drivers; means for activating the first test circuit; and means for activating the second test circuit, thereby sequentially performing the burn-in test for all the memory cells.

To achieve another object of the present invention, there is provided a burn-in test method of a semiconductor memory device comprising the steps of: activating a first test circuit having output terminals connected to input terminals of a first half of the plurality of word line drivers; and activating a second test circuit having output terminals connected to input terminals of a second half of the plurality of word line drivers, thereby sequentially performing the burn-in test for all the memory cells.

BRIEF DESCRIPTION OF THE DRAWINGS

These and various other features and advantages of the present invention are better understood by reference to the following detailed description of the invention, taken in conjunction with the accompanying drawings, wherein.

DETAILED DESCRIPTION OF THE PREFERRED EMBODIMENT

A preferred embodiment of the present invention will be discussed in detail with reference to the accompanying drawings.

Figure 1:
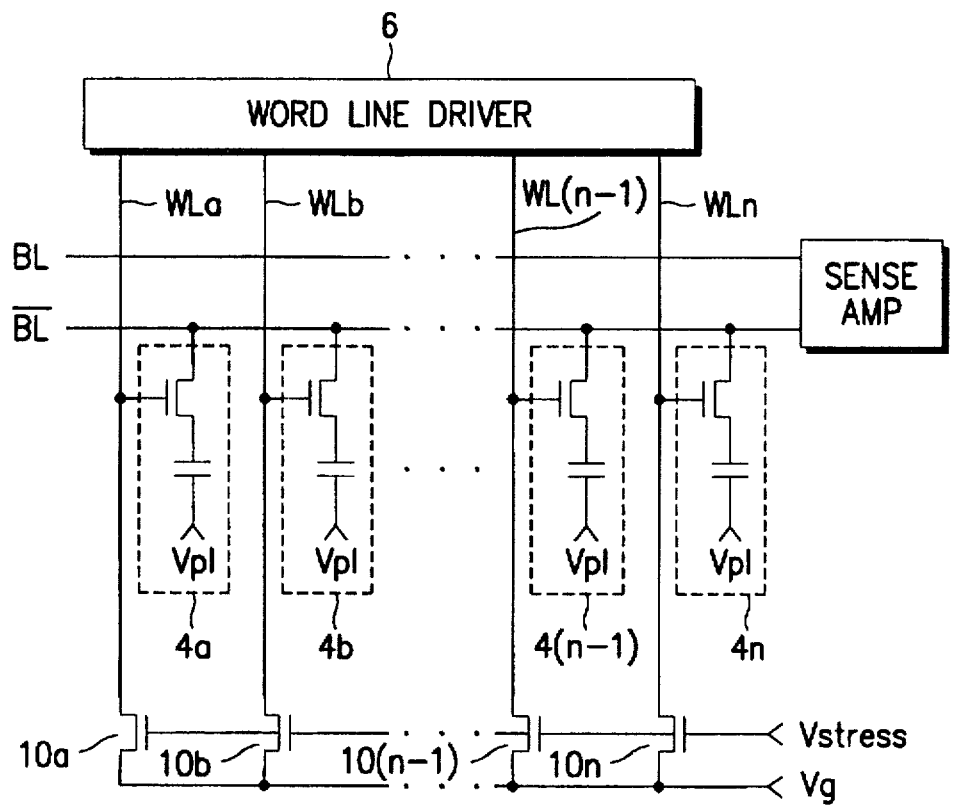
FIG. 1 is a diagram showing a conventional wafer burn-in test circuit.
Figure 2:
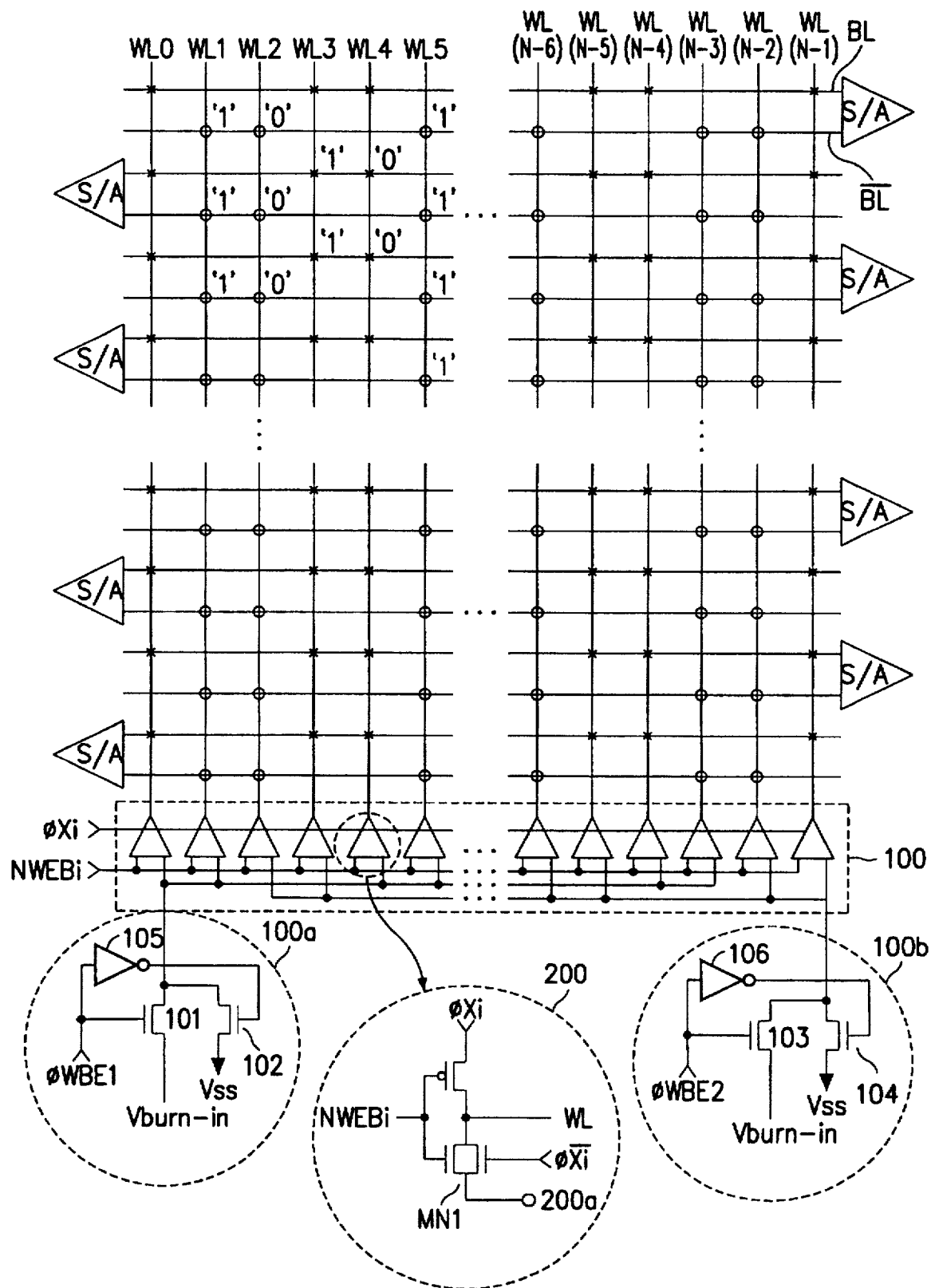
FIG. 2 is a diagram showing a wafer burn-in test circuit according to a preferred embodiment of the present invention.

FIG. 2 is a diagram showing a wafer burn-in test circuit according to a preferred embodiment of the present invention. Referring to FIG. 2, a plurality of memory cells are connected between a plurality of word lines WL0–WL(n−1) and a plurality of bit line pairs BL/$\overline{BL}$. The memory device is constructed in a row stripe pattern where the data stored at the adjacent memory cells have different logic states from each other, while the data stored along the same word line have an identical logic state. Both ends of each bit line pair BL/$\overline{BL}$ are connected to respective bit line sense amplifiers S/A. One end of each word line WL is connected to a respective word line driver. The word line driver may be constructed in various forms well-known in the art, one of which is shown as reference numeral 200.

In the first burn-in test circuit 100a, a first test signal φWBE1 is commonly connected to the gate of an NMOS transistor 101 and the input terminal of an inverter 105. The output terminal of the inverter 105 is connected to the gate of an NMOS transistor 102. One end of the NMOS transistors 101 and 102 are connected to each other and then to the input terminal 200a of the word line driver 200. The other end of the NMOS transistor 101 is connected to a test voltage Vburn-in. The other end of the NMOS transistor 102 is connected to a ground voltage Vss. The construction of the first burn-in test circuit 100a is identical to that of the second burn-in test circuit 100b (including inverter 106 and NMOS transistors 103 and 104) except that in the second burn-in test circuit 100b, a second test signal φWBE2 is input and the output terminal thereof is connected to the remaining word line drivers not already connected to the first burn-in test circuits 100a.

Figure 3:
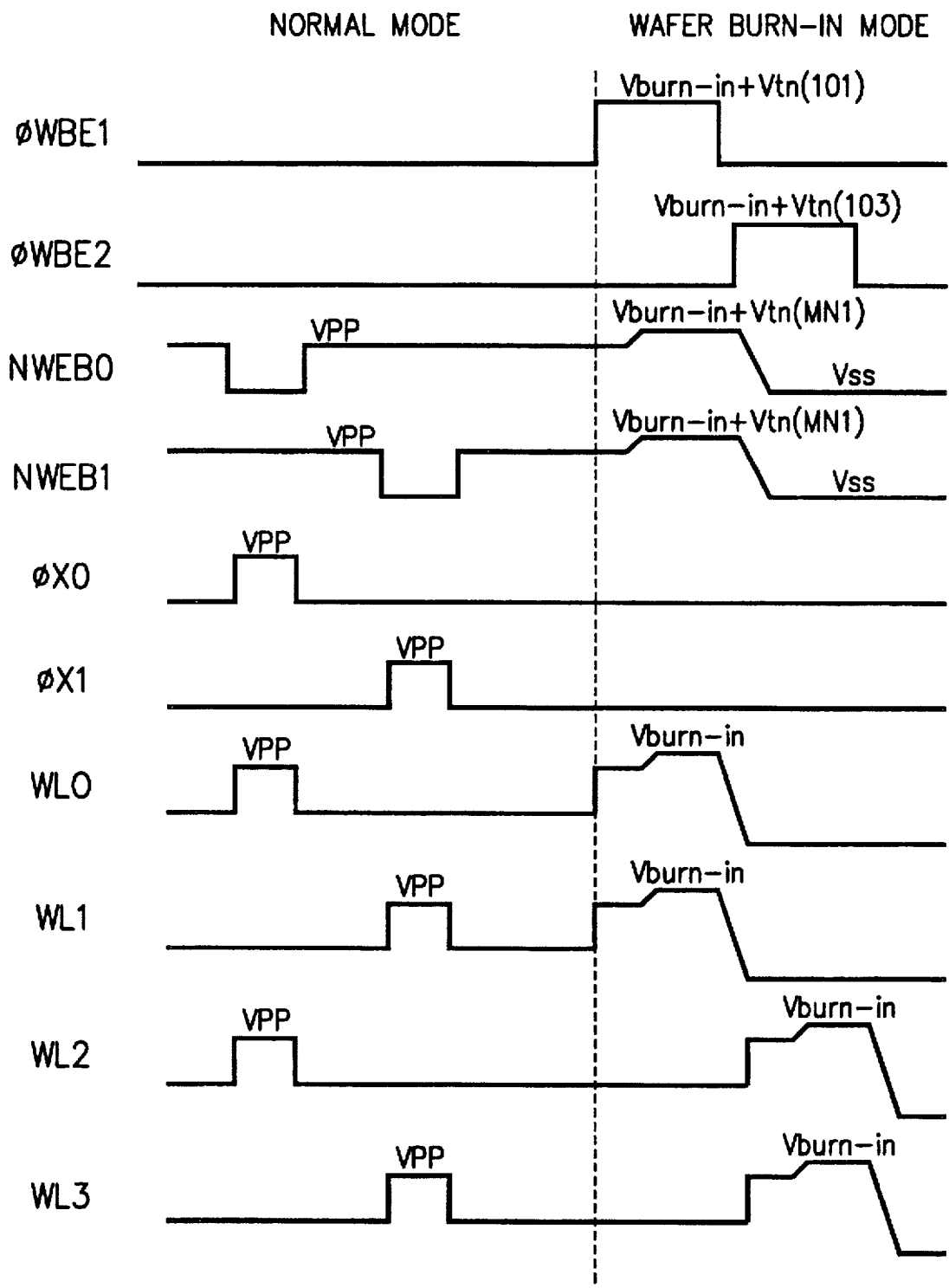
FIG. 3 is a timing diagram showing the operation of FIG. 2.

FIG. 3 is a timing diagram showing the operation of FIG. 2. The operation of the burn-in test circuit according to a preferred embodiment of the present invention will be discussed with reference to FIGS. 2 and 3.

In the normal mode, the first and second test signals φWBE1 and φWBE2 are all at the logic "low" levels, and at this time, the input terminals 200a of the respective word line drivers are connected to the ground voltage Vss via the NMOS transistors 102 and 104. Then, a boosted word line voltage φXi is applied to the designated word line in accordance with the signal NWEBi (Vburn-in+Vtn(MN1)), which is output from a row predecoder for designating a specific word line.

With the change to the wafer burn-in mode, if the first test signal φWBE1 goes to the logic "high" level and the second test signal φWBE2 stays at the logic "low" level, the test voltage "Vburn-in+Vtn(101)" is input to the word lines connected to the first burn-in test circuits 100a. On the other hand, if the first test signal φWBE1 is at the logic "low" level and the second test signal φWBE2 goes to the logic "high" level, the test voltage "Vburn-in+Vtn(103)" is input to the word lines connected to the second test circuits 100b. In accordance therewith, the stress is applied to all the memory cells. In this case, the first and second test signals φWBE1 and φWBE2 are sequentially activated, thus preventing the simultaneous enable of the word lines. That is, certain pairs of word lines (e.g., word lines WL0 and WL1, WL4 and WL5, . . . WL(n−4) and WL(n−3)) are enabled by the first test signal φWBE1 via the NMOS transistors 101 and the remaining pairs of word lines (e.g., word lines WL2 and WL3, . . . WL(n−6) and WL(n−5), WL(n−2) and WL(n−1)) are enabled by the second test signal φWBE2 via the NMOS transistors 103.

As described above, the wafer burn-in circuit of the present invention can accurately test for failed memory cells due to the leakage current even in a row stripe pattern of memory cells, thus increasing the wafer burn-in efficiency.

While there has been illustrated and described what is considered to be preferred embodiment of the present invention, it will be understood by those skilled in the art that various changes and modifications may be made without departing from the scope of the present invention.

What is claimed is:

1. A burn-in test circuit of a semiconductor memory device having a plurality of memory cells connected to at least one bit line, and a plurality of word line drivers for selecting certain of said plurality of word lines connected to said plurality of memory cells, comprising:

a first test circuit having output terminals connected to input terminals of a first half of the plurality of word line drivers;

a second test circuit having output terminals connected to input terminals of a second half of the plurality of word line drivers;

means for activating the first test circuit; and means for activating the second test circuit, thereby sequentially performing the burn-in test for all the memory cells.

2. The burn-in test circuit as claimed in claim 1, wherein said memory cells are constructed in a row stripe pattern where the memory cells connected to a same word line store an identical logic level and wherein adjacent word lines store a different logic level.

3. The burn-in test circuit as claimed in claim 1, said first test circuit comprising:

a first test signal commonly connected to the gate of a first NMOS transistor and an input terminal of a first inverter;

a second NMOS transistor having a gate connected to an output terminal of the first inverter, wherein one end of the first and second NMOS transistors being connected to each other and then to an input terminal of the first half of the plurality of word line drivers, the other end of the first NMOS transistor being connected to a test voltage, and the other end of the second NMOS transistor being connected to ground.

4. The burn-in test circuit as claimed in claim 3, said second test circuit comprising:

a second test signal commonly connected to the gate of a third NMOS transistor and an input terminal of a second inverter;

a fourth NMOS transistor having a gate connected to an output terminal of the second inverter, wherein one end of the third and fourth NMOS transistors being connected to each other and then to an input terminal of the second half of the plurality of word line drivers, the other end of the third NMOS transistor being connected to the test voltage, and the other end of the fourth NMOS transistor being connected to ground.

5. A burn-in test method of a semiconductor memory device having a plurality of memory cells connected to at least one bit line, a plurality of word line drivers for selecting certain of said plurality of word lines connected to said plurality of memory cells, the method comprising the steps of:

activating a first test circuit having output terminals connected to input terminals of a first half of the plurality of word line drivers; and activating a second test circuit having output terminals connected to input terminals of a second half of the plurality of word line drivers, thereby sequentially performing the burn-in test for all the memory cells.

* * * * *